United States Patent
Vecchione et al.

(10) Patent No.: US 7,485,492 B2
(45) Date of Patent: Feb. 3, 2009

(54) PROCESS FOR MANUFACTURING A NON-VOLATILE MEMORY STRUCTURE VIA SOFT LITHOGRAPHY

(75) Inventors: Raffaele Vecchione, Napoli (IT); Roberta Cuozzo, Napoli (IT); Anna Morra, Cercola (IT); Teresa Napolitano, Cimitile (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/697,990

(22) Filed: Apr. 9, 2007

(65) Prior Publication Data

US 2007/0243679 A1    Oct. 18, 2007

(30) Foreign Application Priority Data

Apr. 11, 2006    (IT)    ................ TO2006A0264

(51) Int. Cl.
*H01L 21/44* (2006.01)
*H01L 21/48* (2006.01)
*H01L 21/50* (2006.01)

(52) U.S. Cl. ............... 438/106; 438/127; 257/E21.239; 257/E21.264; 257/E21.267; 257/E21.347; 257/E21.499

(58) Field of Classification Search ................. 438/106, 438/110, 111, 124, 126, 127, 8, 753, 780, 438/798
See application file for complete search history.

(56) References Cited

U.S. PATENT DOCUMENTS 6,876,574 B2 * 4/2005 Giebeler et al. ............. 365/158

7,195,670 B2 * 3/2007 Hansen et al. ................ 117/68

OTHER PUBLICATIONS

Soft-Lithography, 1998, USA, Younan Xia.*
T. Kawase, et al., "All-Polymer Thin Film Transistors Fabricated by high-Resolution Ink-jet Printing", Cavendish Laboratory, University of Cambridge, Cambridge US, Epson Cambridge Laboratory, Cambridge UK, 2000 IEEE; pp. 623-626.
Qidan Ling, et al., "Non-Volatile Polymer Memory Device Based on a Novel Copolymer of N-Vinylcarbazole and Eu-Complexed Vinylbenzoate" Adv. Mater. 2005, 17, No. 4, Feb. 23, pp. 455-459.

(Continued)

*Primary Examiner*—David Nhu
(74) *Attorney, Agent, or Firm*—Lisa K. Jorgenson; James H. Morris; Wolf, Greenfield & Sacks, P.C.

(57) ABSTRACT

A process for manufacturing a non-volatile memory structure, in particular of a cross-point type provided with an array of memory cells, including forming bottom electrodes on a substrate; forming areas of active material on the bottom electrodes; and forming top electrodes on the areas of active material. The memory cells are defined at the intersection of the bottom electrode with the top electrode. At least one from among the steps of forming bottom electrodes, forming areas of active material, and forming top electrodes includes using soft-lithography techniques, chosen from amongst "microtransfer molding", "micromolding in capillary", and "microcontact printing". According to a first type of structure, the step of forming areas of active material includes forming strips of active material in a way self-aligned with respect to the bottom electrodes or the top electrodes; according to a different type of structure, the step of forming areas of active material envisages forming monolayer or multilayer pads between the bottom electrodes and the top electrodes.

19 Claims, 7 Drawing Sheets

OTHER PUBLICATIONS

H.K. Henisch et al., "Switching in organic polymer films" Materials Research Laboratory, The Pennsylvania State University Park, Pennsylvania 16802, Appli3ed Physics Letters, vol. 24, No. 12, Jun. 15, 1974, pp. 589-591.

K.N. Narayanan Unni, et al., "A nonvolatile memory element based on a quaterthiophene filed-effect transistor" Science Direct, Materials Letters 59 (2005) pp. 1165-1168.

Anirban Bandyopadhyay, et al., "Key to design functional organic molecules for binary operation with large conductance switching" Science Direct, Chemical Physics Letters 371 (2003) pp. 86-90.

Anirban Bandyopadhyay, et al., "Large conductance switching and memory effects in organic molecules for data-storage applications" Applied Physics Letters, vol. 82, No. 8, Feb. 24, 2003, pp. 1215-1217.

Thomas Mikolajick, et al., "The Future of Nonvolatile Memories" Infineon Technologies Dresden, IFDD MDC TIN, Infineon Technologies, MP TI TD INN, date unknown.

Younan Xia, et al., "Soft Lithography" Department of Chemistry and Chemical Biology, Harvard University, Cambridge, MA, Annu. Ref. Mater. Sci. 1998 28:153-184.

Younan Xia, et al., "Soft Lithography" Angew. Chem. Int. Ed. 1998, 37, 5505-75.

Marko Uplaznik, "Introduction to nonotechnology—soft lithography", University of Ljubljana, Faculty of Mathematics and Physics, Department of Physics, pp. 1-23, date unknown.

Andre DeHon, et al. "Nonphotolithographic Nanoscale Memory Denisty Prospects" IEEE Transactions on Nanotechnology, vol. 4, No. 2, Mar. 2005, pp. 215-228.

\* cited by examiner

PROCESS FOR MANUFACTURING A NON-VOLATILE MEMORY STRUCTURE VIA SOFT LITHOGRAPHY

RELATED APPLICATION

The present application claims priority under 35 U.S.C. §119 to Italian Patent Application No. TO2006A000264, filed on Apr. 11, 2006.

BACKGROUND OF THE INVENTION

1. Field of the Invention

The present invention relates to a process for manufacturing a non-volatile memory (NVM) structure using a so-called "soft lithography" technique. In particular, the ensuing treatment will make explicit reference, without this implying any loss of generality, to the fabrication of a completely organic or hybrid non-volatile memory.

2. Discussion of the Related Art

As is known, non-volatile memories, i.e., memories which retain stored data even in the absence of a power supply, are by now widespread in many fields of electronics. The traditional architecture of these memories envisages the use of a floating gate as a memory element, set underneath a control-gate electrode. Operation of the device exploits coupling of the two gates, separated by a dielectric material and set on top of one another on the channel between the source and the drain. The charge accumulated in the floating gate physically constitutes the datum stored in the memory element.

With the aim to improve integration, while reducing costs, and to improve the performance in terms of read and write speed, duration, and voltages applied, in the last few years alternative non-volatile memories have been proposed, characterized by innovative materials and structures. Amongst the innovative non-volatile memories, the ones that seem to be the most promising, in terms of possibility of integration, are organic memories, which use as active material polymers or small molecules, and in particular totally organic memories (i.e., ones which use only organic materials), and hybrid memories (i.e., ones which use traditional materials, for example metal materials, in combination with organic materials). Organic memories can, in fact, potentially undergo a scaling down to the individual molecule and hence enable extremely compact dimensions to be achieved.

The organic material is generally arranged between two electrodes, which are made of metal material, or alternatively which are also made of organic material, according to simple cross-point structures, possibly arranged in vertical stacks (multilayers) in order to further increase the density of the cells. Data are stored in the individual cells exploiting switching of an electrical behavior of the organic material, in particular according to two different types of operation, based upon a ferroelectric or resistive behavior of the organic material. Between the two different types, the one that seems to be more advantageous is based upon switching of a resistive state (high or low) of the organic material as a function of electrical quantities applied thereto through the respective electrodes.

It is also known that, although current manufacturing techniques on silicon substrates based upon conventional lithography, i.e., upon the use of ultraviolet (UV) radiation sources, are technologically advanced and well consolidated, above all on account of the reliability of the devices obtained, they do not enable markedly scaled dimensions, for example less than 30-40 nm, to be achieved. In addition, achievement of such small dimensions implies extremely high production costs. The resolution of the structures that can be obtained is in any case limited by the wavelength of the radiation used, as well as by the cost of the process, which, as has been said, is the higher, the smaller the dimensions of the structures that it is desired to produce. In addition, with conventional lithography, the use of organic materials is particularly critical, because they can readily undergo damage during processes employing resist masks and chemical etching.

In order to achieve increasingly demanding scaling of the memory structures, there have consequently been proposed manufacturing techniques alternative to conventional lithography. Amongst these, very promising seems to be soft lithography, which employs rather simple mechanical processes, such as molding, stamping, and pressing. For a general review on this technology, reference may be made, for example, to Y. Xia, G. M. Whitesides, Soft Lithography, Angew. Chem. Int. Ed. 1998, 37, 550-575. Soft lithography is encountering an increasingly greater interest in so far as it enables the limit of the optical diffraction to be overcome enabling structures to be obtained that are smaller and, given the same dimensions, have a lower cost; it also enables processing of organic materials.

In summary, soft-lithography techniques (amongst which the "microcontact printing", "replica molding (REM)", "microtransfer molding (mMT)", "micromolding in capillary (MIMIC)", "solvent-assisted micromolding (SAMIM)", "embossing", and "injection molding") have in common the use of molds made of "soft" material, whence the name of the technology, which are used for forming the desired structures on top of a substrate. The material most widely used for producing the molds is currently polydimethylsiloxane (PDMS), on account of its properties of strength and elasticity due to the presence of siloxane groups along the chain and methylene groups. However, other materials can be used for producing the mold, such as polyurethanes, polyamides, polymethacrylates or thermosetting resins and other types of polymers with suitable requisites.

Up to now, although potentially enabling extremely small dimensions to be achieved with a lower manufacturing cost and the use of a wide range of materials (even polymeric ones), soft-lithography techniques have not found wide use in the fabrication of electronic devices, principally due to difficulties in the formation of the various superimposed layers that generally make up these devices. In particular, it is problematical the alignment of these layers, or, in a similar way, it is problematical to subsequently align the mold with previously deposited layers. In the case, for example, of memory structures, the absence of alignment between the layers can jeopardize proper operation. Accordingly, there is a need for manufacturing processes enabling full exploitation of the potentialities of this new lithographic technology.

SUMMARY OF THE INVENTION

One aim of the present invention is to provide a manufacturing process that will enable the aforesaid problems and disadvantages to be overcome, and in particular that will enable a non-volatile memory structure to be obtained having compact size and low manufacturing costs.

According to one embodiment a process for manufacturing a non-volatile memory structure is provided comprising: forming bottom electrodes on a substrate; forming areas of active material on said bottom electrodes; and forming top electrodes on said areas of active material, memory cells of said non-volatile memory structure being defined at the intersection of said bottom electrodes with said top electrodes; wherein at least one of said steps of forming bottom electrodes, forming areas of active material, and forming top electrodes comprises use of soft-lithography techniques.

BRIEF DESCRIPTION OF THE DRAWINGS

For a better understanding of the present invention, preferred embodiments thereof are now described purely by way of non-limiting example and with reference to the attached plate of drawings, wherein.

DETAILED DESCRIPTION

As will be described in detail, one aspect of the present invention envisages the formation of a non-volatile memory structure with two electrodes (a bottom electrode and a top electrode, set between which is an appropriate active material, for example of an organic type) using soft-lithography techniques (in particular using only these techniques). Some of the embodiments that will be described further enable a self-alignment (i.e., an alignment guaranteed automatically by the process steps envisaged) of some of the layers constituting the final memory structure, in particular of a region of active material with a corresponding bottom or top electrode.

Figure 1:
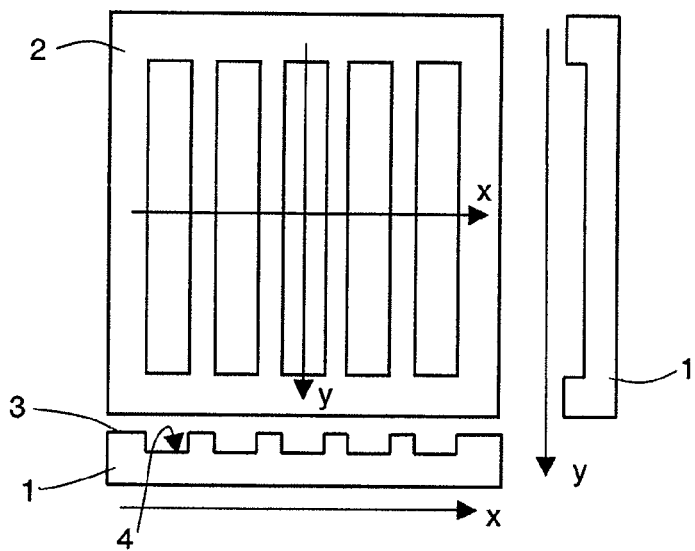
FIG. 1 shows a master for a mold for soft-lithography techniques and a corresponding photomask for its formation.

In detail, the manufacturing process according to the present invention initially envisages (FIG. 1) formation of a master 1 for forming a mold for soft lithography. In a known way, a photoresist layer (or a layer made of any other appropriate material) is deposited on a layer of silicon, silica or other material, and then is subjected to a process of optical lithography (for example via an appropriate photomask 2) or of e-beam lithography or focus-ion-beam (FIB) lithography for defining the master 1. The master 1 (as may be seen also in FIG. 2) has a plurality of portions in relief 3 elongated in the form of strips in a first direction y, which succeed one another in a second direction x and are spaced apart by grooves 4, which are also elongated in the form of strips. In particular, the portions in relief 3 extend all parallel to one another and to the grooves 4.

Figure 2:
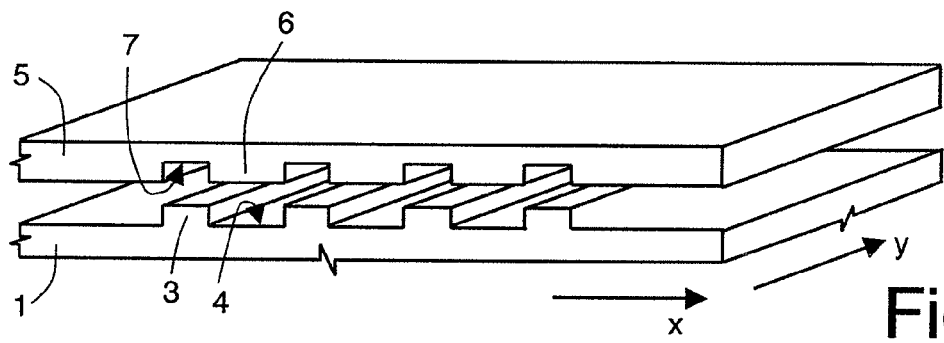
FIG. 2 is a perspective cross-sectional view of a mold made of PDMS obtained on the master produced via optical or electron-beam (e-beam) lithography.

As shown in FIG. 2, a mold 5 made of polymeric material, typically PDMS, is formed on the master 1. In detail, the master 1 is coated with a solution of a chemical precursor of PDMS to which an appropriate activating agent has been added, which includes, for example, in a mix of a complex of platinum and of copolymers of hydroxymethyl silane and dimethylsiloxane. This solution at room temperature is able to permeate the grooves 4 perfectly, and the precursor, thanks to the presence of the activating agent, hardens rapidly transforming into an elastic solid and thus forming the mold 5. As may be readily appreciated, the latter has a shape dual with respect to that of the master 1, and hence has respective strip-like portions in relief 6 in positions corresponding to the grooves 4 of the master, and respective grooves 7, which are also strip-shaped, in positions corresponding to the portions in relief 3 of the master. The mold 5 is then released from the master 1 and is available for successive steps of soft lithography. In this connection, it is emphasized that elastomeric materials, such as specifically PDMS, enable an easy release of the mold. Before using the precursor, it may be convenient to subject the master 1 to a treatment of silanization, which can be carried out by means of a vapor of $CF_3(CF_2)_6(CH_2)_2SiCl_3$. This treatment is useful both for reproducing with greater accuracy the structures of the master in the mold and for preserving the master for subsequent uses.

Then the process continues with the formation of the superimposed layers that will form the non-volatile memory structure, and in particular the bottom electrode layer, the active material layer, and the top electrode layer. According to an aspect of the present invention, these layers are formed by means of soft-lithography techniques, such as microtransfer molding, micromolding in capillary, and microcontact printing.

A first embodiment of the present invention (for providing a first type of memory structure) envisages the use of the microtransfer-molding technique.

Figure 3:
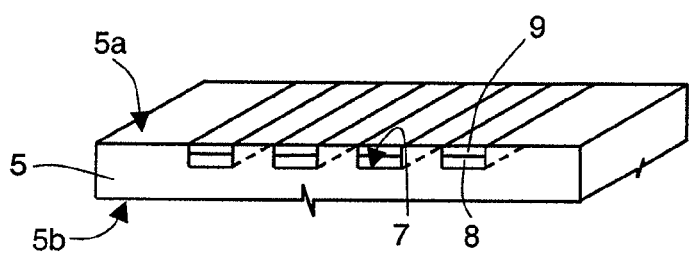
FIGS. 3-6 are perspective sectional views of successive steps of fabrication of a first type of memory structure according to a first embodiment of the present invention.

In detail (FIG. 3), the grooves 7 of the mold 5 are filled first partially with respective regions of active material 8 and then, flush with a first surface 5a of the mold 5, with respective bottom-electrode regions 9. It should be noted that these regions are automatically aligned. Non-patterned surface 5b is the back of the mold 5.

The bottom-electrode regions 9 can be made of polymeric material. In this case, it is possible, for example, to deposit by casting or by capillarity within the grooves 7 a polyaniline (PANI) solution in m-cresol, or else a solution in water of a poly-3,4-ethylendioxythiophene (PEDOT) base, or else a solution of carbon particles in ethanol. Alternatively, the bottom-electrode regions 9 can be made of metal material. In this case, it is possible to use solutions of inorganic metallic precursors, or else organic precursors, such as mercaptides. The latter are preferable in that they do not require the presence of a further solution of reducing agents, simply exploiting the effect of the temperature for their decomposition and for forming the metal material. The regions of active material 8 (which can be made of a single layer or superimposed layers) are formed by depositing in the grooves 7, for example by casting, solutions of polymers or polymers with metallic nanoparticles or small organic molecules having a bistable behavior. For these solutions it is important to use materials and solvents such as not to degrade the mold or layers already deposited. Tests carried out by the present applicant have identified the following materials that can be used for the purpose: polystyrene with gold nanoparticles (PS+Au-NPs)

combined with acetone; poly[vinyl carbazole-co-eu(vinyl benzoate)(2-thenoyl trifluoroacetone) phenanthroline] (PKEu) combined with tetrahydrofuran; polymethylmethacrylate (PMMA) combined with methyl ethyl ketone; polybuthylmethacrylate (PBMA) combined with methyl ethyl ketone; poly(vinylidene fluoride-trifluoroethylene) (P(VDF-TrfE)) combined with methyl ethyl ketone; or else molecules of rose Bengal, fluorescine or its derivatives, combined with methanol. Possibly, solutions of precursors of the materials listed above can be used, which can be polymerized thermally or else via the use of UV radiation.

Figure 4:
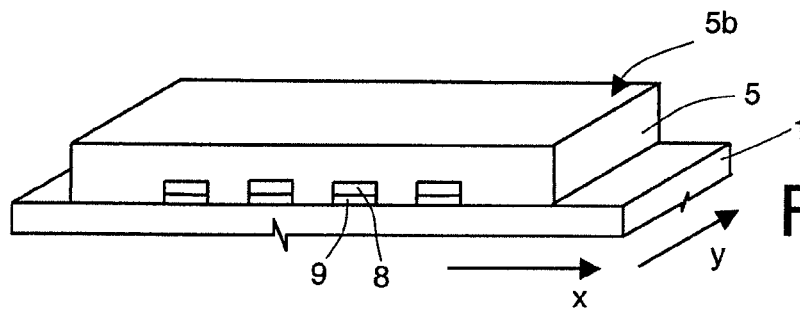

Next (FIG. 4), after possible cleaning of the mold from the excess material that has come out from the first surface 5a, the mold 5 is turned upside down and set on a substrate 10 of a conventional type (for example, silicon, glass, etc.), or of a flexible polymeric type (made of PET, PI, etc.). The memory structure will be formed on the substrate 10.

There follows a step of consolidation of the material present in the mold, for example via thermal or UV treatment in the case where the material for filling of the mold is a prepolymer, or via evaporation of the corresponding solvent in the case where the filling material is a solution. After consolidation, the mold 5 is removed, leaving on the substrate 10 bottom-electrode strips 11, parallel to one another and extending in the first direction y (and corresponding to the bottom-electrode regions 9), overlaid in an aligned way by active-material strips 12 (corresponding to the regions of active material 8). It should be noted that, thanks to the described process of deposition, the active-material strips 12 are automatically aligned to the bottom-electrode strips 11 in the first direction y. In addition, in the second direction x, the strips are physically separate so as to eliminate in this direction any problem of cross-talk between memory cells.

Figure 5:
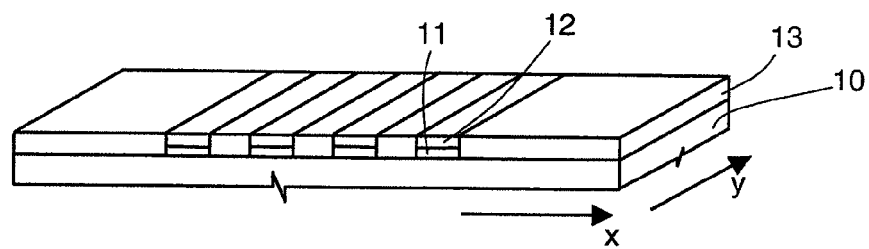

Next, the empty spaces between the strips of bottom electrode and active material in the second direction x can be filled, for example, with dielectric regions 13 of organic material (shown only in FIG. 5). In particular, in order to obtain filling of these areas, it is alternatively possible to: deposit the dielectric material everywhere and then, by means of a post-treatment, planarize the structure thus obtained as far as the height of the active-material strips 12 so as to enable exposure thereof; or else, fill these areas by capillarity using, for example, a second non-patterned surface 5b of the back of the mold 5, which is set on the active-material strips 12. It should be noted that the dielectric regions 13 not only insulate the memory elements from one another, but also perform the function of supporting strips of top electrode that will subsequently be formed. In order to form the dielectric regions 13, on the intermediate structure previously formed, a solution of polyethylene terephthalate (PET) in m-cresol is deposited, for example by casting, so as to obtain, after evaporation of the solvent, a film of the same thickness as that of the aforesaid intermediate structure. Possibly, also other polymeric materials normally used as substrate can be deposited, for example, a solution of polycarbonate in tetrahydrofuran (THF) or polyethylene naphthalate (PEN).

Figure 6:
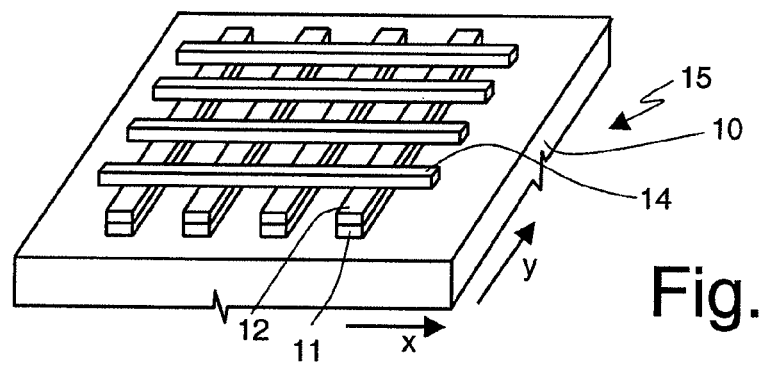

The top-electrode strips 14 are then deposited, using the same mold 5. For this purpose, the mold 5 is filled with top-electrode regions (in a way similar to what has been described previously) and then turned upside down on the structure already made, rotated through 90° with respect to its previous use. In this way, the top-electrode strips 14 are orthogonal to the underlying stacked strips, without there arising problems of alignment. After a consolidation step, the mold 5 can then be removed, leaving on the substrate 10 a memory structure 15 of a cross-point type, comprising an array of memory cells arranged at the intersections of the bottom- and top-electrode strips 11, 14 (FIG. 6).

Figure 7:
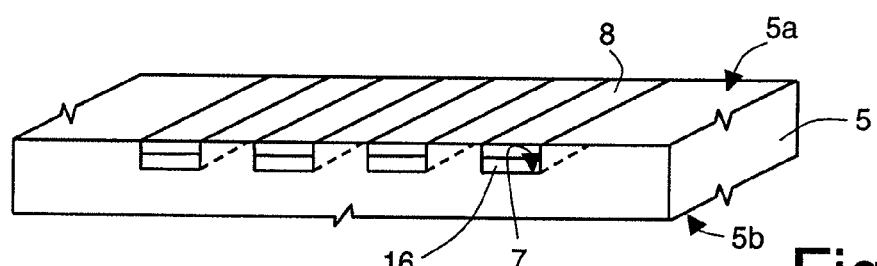
FIGS. 7-8 are perspective sectional views of manufacturing steps according to a variant of the first embodiment of the present invention.
Figure 8:
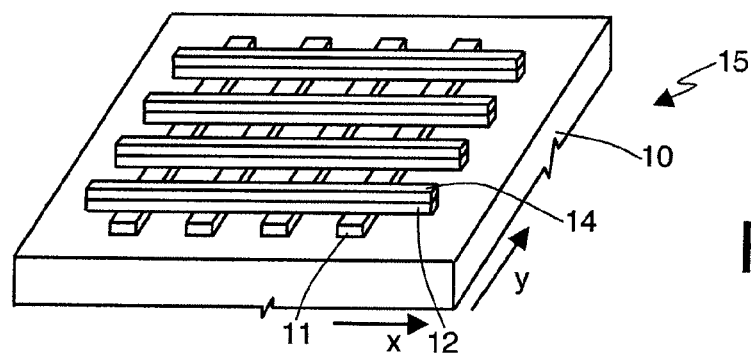

A possible variant of the first embodiment envisages first of all the deposition of the bottom-electrode strips 11 on the substrate 10, using the mold 5 arranged according to a first orientation. Next, after possible filling with the dielectric regions 13 of the empty spaces between the bottom-electrode strips 11, the grooves 7 of the mold 5 are filled this time first with top-electrode regions 16 and then with the regions of active material 8 (FIG. 7). Then, the mold 5 is turned upside down on the intermediate structure previously formed, with a second orientation rotated through 90° with respect to the first orientation, for simultaneous deposition of the active-material strips 12 and of the top-electrode strips 14. Also in this case, the memory structure 15 is obtained (FIG. 8) without any problems of alignment, given that the last two layers are self-aligned (and oriented this time in the first direction x) and are orthogonal with respect to the first layer formed on the substrate 10.

It should be noted that in both of the variants, the first type of memory structure has active-material strips 12 automatically aligned, throughout their extension, with respective strips of bottom or top electrode.

A second embodiment of the first type of memory structure envisages use of a different soft-lithography technique, in particular the micromolding-in-capillary technique.

Figure 9:
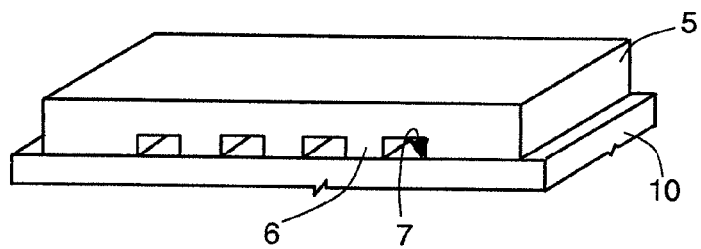
FIGS. 9-12 are perspective sectional views of successive manufacturing steps in accordance with a second embodiment of the first type of memory structure of the present invention.
Figure 10:
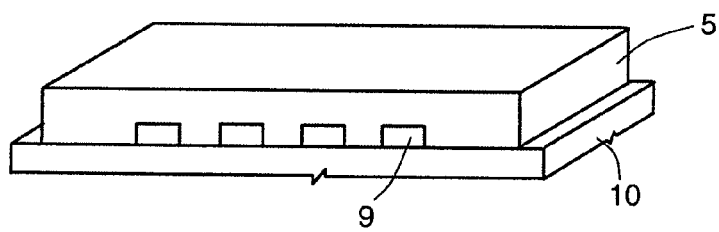

In detail (FIG. 9), the mold 5, obtained as described previously, is laid on the substrate 10. Then, an appropriate material for providing the bottom-electrode regions 9, in a low-viscosity solution, is set in fluidic communication with openings of the grooves 7 of the mold 5. The solution penetrates by capillarity within the grooves 7 and fills the grooves 7 progressively and completely, forming inside them the bottom-electrode regions 9 (FIG. 10).

Figure 11:
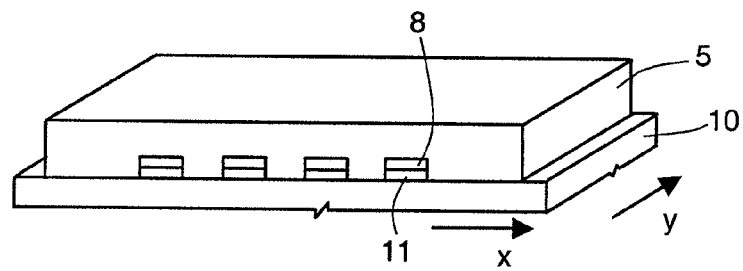
Figure 12:
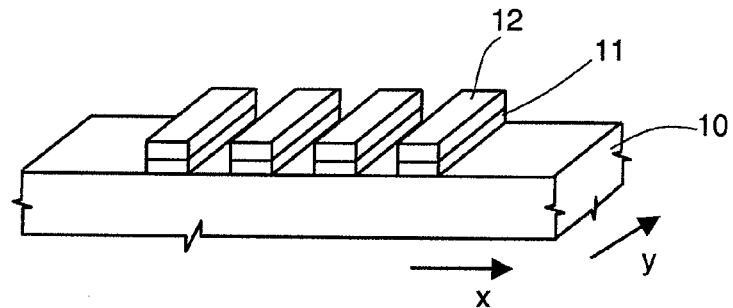

Next, the material introduced is consolidated, by evaporation of the solvent, to form the first electrode strips 11. In particular, evaporation of the solvent entails a reduction in the thickness of the resulting structure with respect to the height of the grooves 7 (the width is instead respected). Thanks to the reduction in thickness, without displacing the mold 5 (and hence also in this case guaranteeing self-alignment of the process), it is thus possible to introduce within the grooves 7, and once again by capillarity, a solution of active material, to form regions of active material 8 (FIG. 11). There follows a further step of consolidation of the solution of active material and removal of the mold 5 from the substrate 10 so as to obtain the active-material strips 12 on top of, and aligned to, the underlying bottom-electrode strips 11 (FIG. 12).

The memory structure can then be completed with the formation of the top-electrode strips 14 by means of microtransfer molding or else micromolding in capillary through the same mold 5.

In a way similar to what has been described previously, a variant of the second embodiment envisages reversing the order of filling of the mold 5, and, in particular, first forming on the substrate the bottom-electrode strips, and then forming in a self-aligned way, with micromolding in capillary, the active-material and the top-electrode strips.

A third embodiment of the first type of memory structure envisages the use of yet a different technique of soft lithography, in particular, the microcontact-printing technique.

Figure 13:
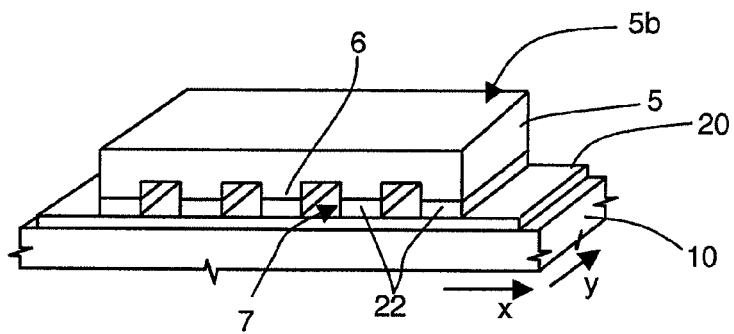
FIGS. 13-16 are perspective sectional views of successive manufacturing steps according to a third embodiment of the first type of memory structure of the present invention.

In detail, in this case, a metal layer 20, for example of gold or silver, is first formed on the substrate 10 (FIG. 13).

Figure 14:
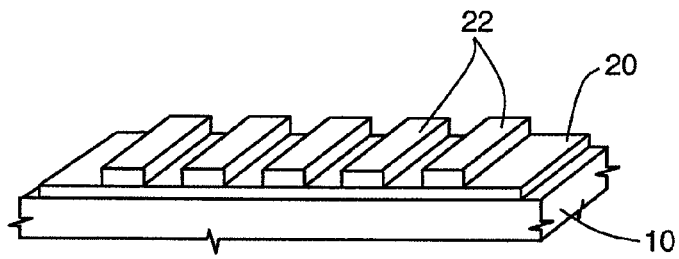

The portions in relief 6 of the mold 5 are then exploited for transferring on the metal layer 20 a self-assembled monolayer (SAM) pattern 22, for example of thiols, which are released by contact. Next, the mold 5 is removed (FIG. 14). In a known way, the self-assembled molecules have the property of aggregating spontaneously in structures that are stable and well-defined by non-covalent interactions. As self-assembled molecules it is possible to use alternatively other molecules constituted by an alkyl chain terminating with a polar head, for example alkanthiols, in which the polar head is constituted by a sulphur atom. The thickness of the SAM can be regulated by modifying the length of the alkyl chain.

Figure 15:
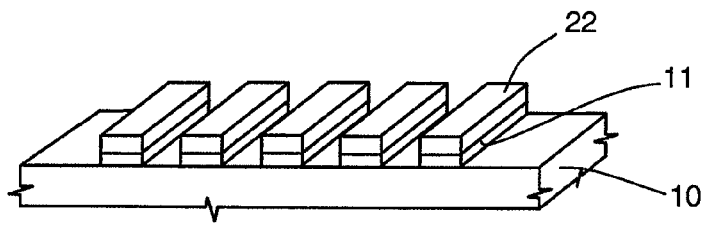

Then (FIG. 15), the SAM pattern 22 is used as mask for carrying out a selective etching of the underlying metal layer 20, following upon which metallic strips are formed underneath this pattern (the bottom-electrode strips 11). In this regard, given that generally a SAM has a thickness of just a few nanometers, it is important to choose the solution to be used for etching in order to preserve the integrity of the SAM.

Figure 16:
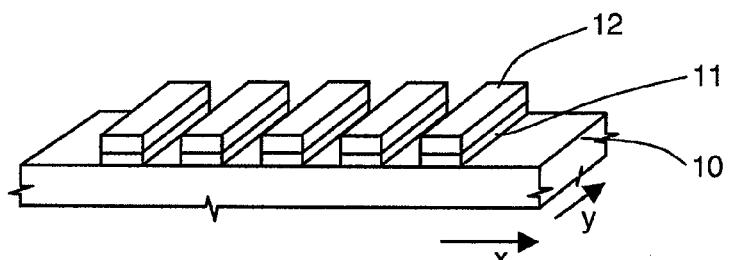

Before its removal, the SAM pattern 22 is used as a template for a selective deposition of the active organic material, in solution or in vapor phase. The active material is then consolidated so as to form the active-material strips 12 on top of, and once again self-aligned to, the bottom-electrode strips 11 (FIG. 16).

Using the same mold 5, in a way similar to what has been described previously, the top-electrode strips 14 can then be formed, once again without problems of alignment, given that these strips are orthogonal to the already deposited strips.

A further embodiment of the present invention envisages a different approach to provide a second type of memory structure, once again using soft-lithography techniques. In particular, the second type of memory structure envisages the presence of the regions of active material only at the intersection between the top and bottom electrodes. The regions of active material define in this case pads in the form of small pillars, instead of strips. This second type of memory structure is advantageous in so far as it is immune from problems of cross-talk in both the first direction x and the second direction y (there is in fact no continuity of active material either in the first or second direction).

Figure 17:
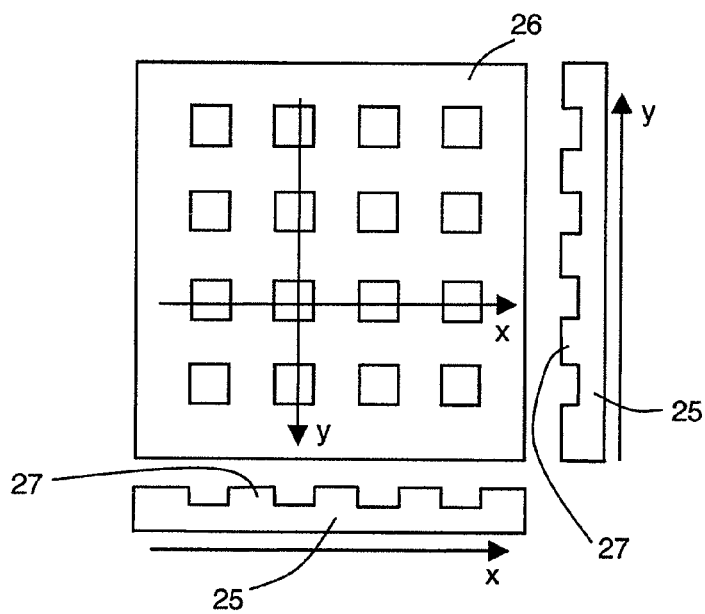
FIG. 17 shows a master for a mold for soft-lithography techniques and a corresponding photomask for its formation, for obtaining a second type of memory structure according to the present invention.
Figure 18:
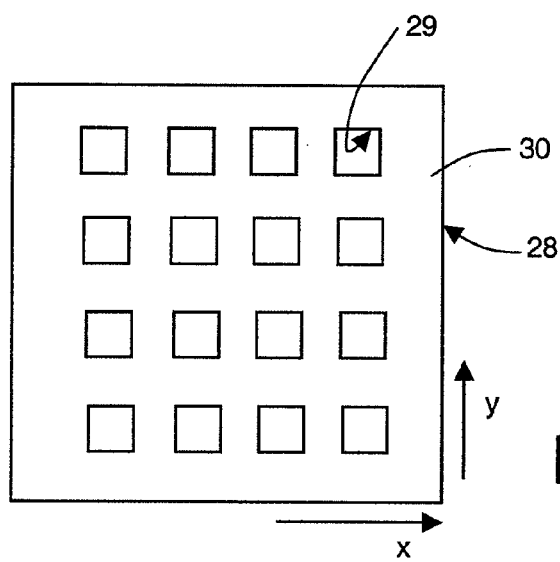
FIG. 18 is a top plan view of a mold obtained on the master of FIG. 17.

In detail, in addition to the mold 5 with grooves in the form of parallel strips, in this case the use of a further mold is required, and hence the formation of a second master 25 for providing the further mold (FIG. 17). The master 25, obtained, for example, via an appropriate photomask 26, has pillar-shaped portions in relief 27 that extend starting from a layer of silicon, silica or other material. The resulting further mold 28 (FIG. 18), has a dual structure, and consequently a plurality of cavities 29, having all a same shape, delimited by a portion in relief 30, which is grid-shaped. In particular, the cavities 29 are aligned to one another in the first direction y and separated in the second direction x by the same distance of separation present between the grooves 7 of the mold 5 with parallel strips.

Figure 19:
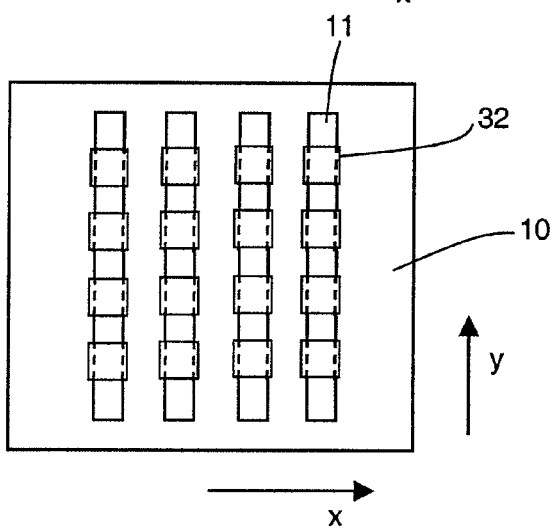
FIGS. 19-20 show top plan views corresponding to successive steps of the process for manufacturing the second type of memory structure.

The manufacturing process starts in this case (FIG. 19), with the formation on the substrate 10 of the bottom-electrode strips 11, using the mold 5 with parallel strips and employing any described technique of soft lithography (microtransfer molding, micromolding in capillary, or microcontact printing). Next, the cavities 29 of the further mold 28 are filled with organic material, and the further mold 28 is then turned upside down and aligned in an appropriate way to the bottom-electrode strips 11. After evaporation of the solvent, the organic material is deposited on these strips, as shown in FIG. 19, forming pads of organic material 32 arranged according to a desired pattern on the bottom-electrode strips 11.

Figure 20:
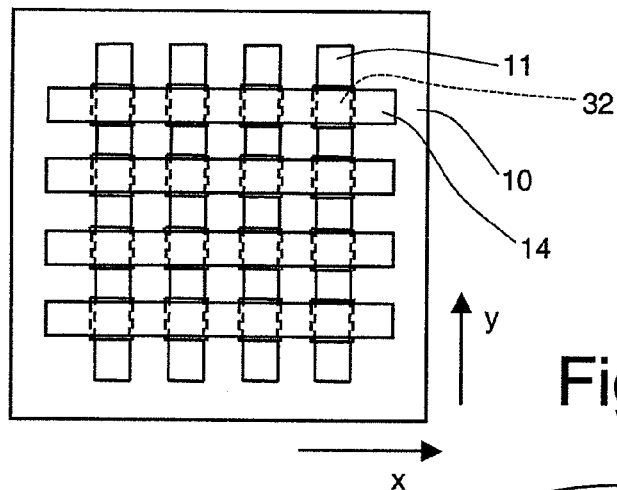

Next the top electrodes are deposited. For this purpose, the mold 5 with parallel strips is once again used, the grooves 7 of which are filled with the top-electrode material. The mold 5 is rotated through 90° with respect to the bottom-electrode strips 11 and aligned in an appropriate way to the pads of organic material 32. After consolidation of the material, the mold 5 is removed, and the memory structure of FIG. 20 is obtained, with the top-electrode strips 14 arranged on the pads of organic material 32. As has been described previously, also in this case, prior to formation of the top-electrode strips 14, the underlying empty spaces can be advantageously filled with dielectric regions.

According to a possible variant of this further embodiment (which envisages, as has been described, the use of organic material patterned in both directions for providing the second type of memory structure), multilayer active pads are arranged between the top and bottom electrodes.

Figure 21:
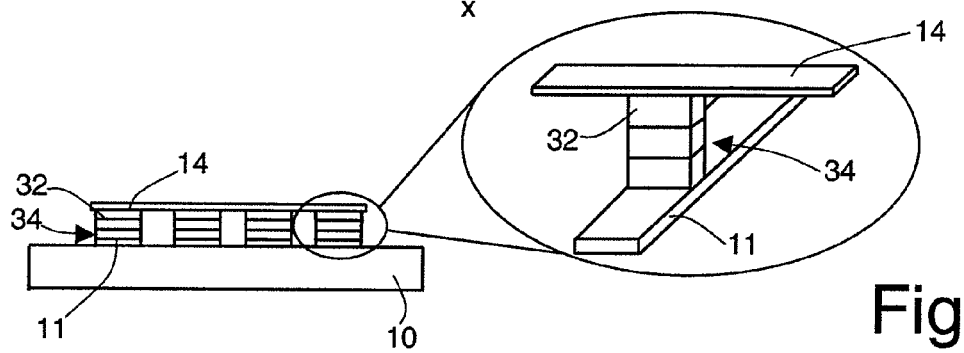
FIG. 21 is a cross-sectional view of the second type of memory structure in a final step of the manufacturing process, with details enlarged for greater clarity.

In detail, after formation of the bottom-electrode strips 11 on the substrate 10, the cavities 29 of the further mold 28 are filled first with a solution of active material and then, after evaporation of the corresponding solvent, with the same solution used for making the bottom and top electrodes, and finally again with the solution of active material. In this way, in a manner similar to what has been described previously, between the bottom-electrode strips 11 and the top-electrode strips 14, as shown in the enlarged detail of FIG. 21, pads of organic material 32 can be formed, made of a multilayer 34 constituted by a "sandwich" of active material, electrode material, and once again active material, and having a total thickness equal to the depth of the cavities 29. In this case, the deposition process using the same mold guarantees a self-alignment between the various layers that make up the multilayer 34.

The advantages of the manufacturing process according to the invention emerge evidently from the above description.

In any case, it is emphasized once again that this process enables non-volatile memory structures to be made at low cost and with a high scaling capacity via the use of soft-lithography techniques. In particular, according to some embodiments, a self-alignment of a layer of active material with a corresponding layer of (bottom or top) electrode is guaranteed during the steps of formation of the memory structure.

The dimensions of the individual memory cells are defined by the intersection of two strips of electrodes, namely, of the bottom one and of the top one. Consequently, the minimum dimension of the memory cells is defined by the resolution of the lithographic techniques used, which in turn are basically linked to the minimum dimensions of the master used for producing the mold. Since the master can be produced with high-resolution techniques, such as e-beam or FIB, the minimum dimensions that can be achieved can be advantageously less than 20 nm. In the case of the structures proposed, given that the molds produced are rather simple (they generally have only parallel grooves), it is effectively possible to achieve these levels of scaling. Only in the case of micromolding in capillary can the minimum dimensions be slightly higher, around 50 nm, on account of the difficulties in filling by capillarity channels having the length of, for example, even tens of microns.

The described process is also extremely versatile, and is suited, by designing appropriate molds, for obtaining a wide range of structures that are differentiated in terms of dimensions and geometries.

Figure 22:
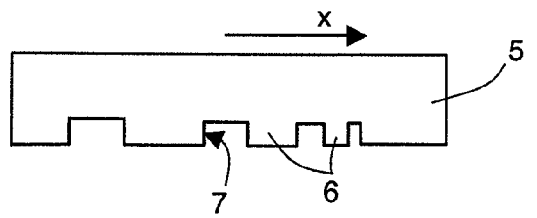
FIGS. 22-25 show possible variants of the present invention, for example for the formation of test patterns.
Figure 23:
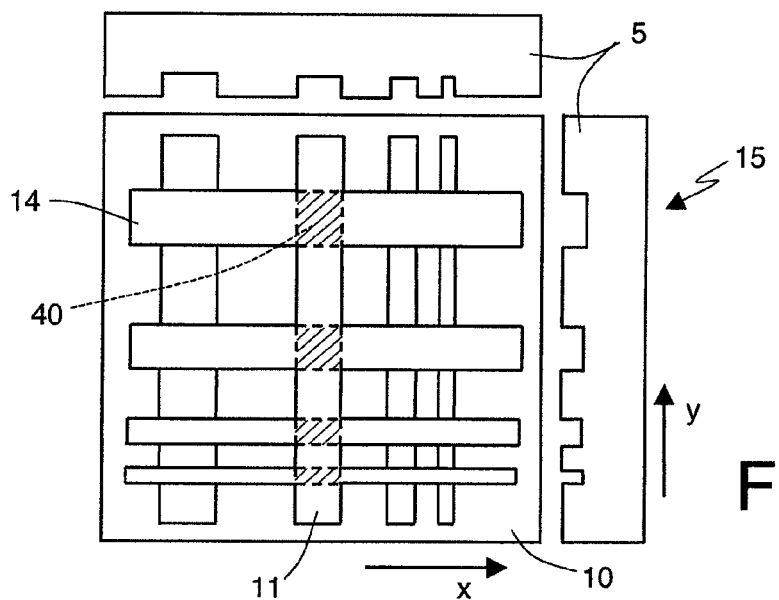
Figure 24:
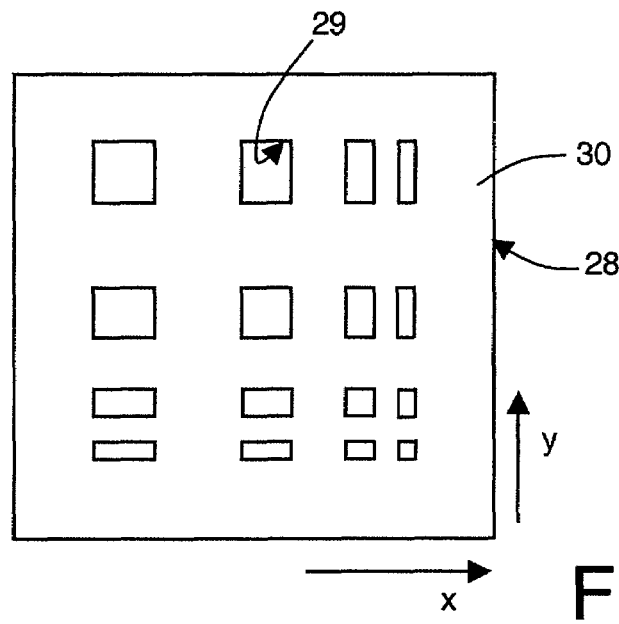
Figure 25:
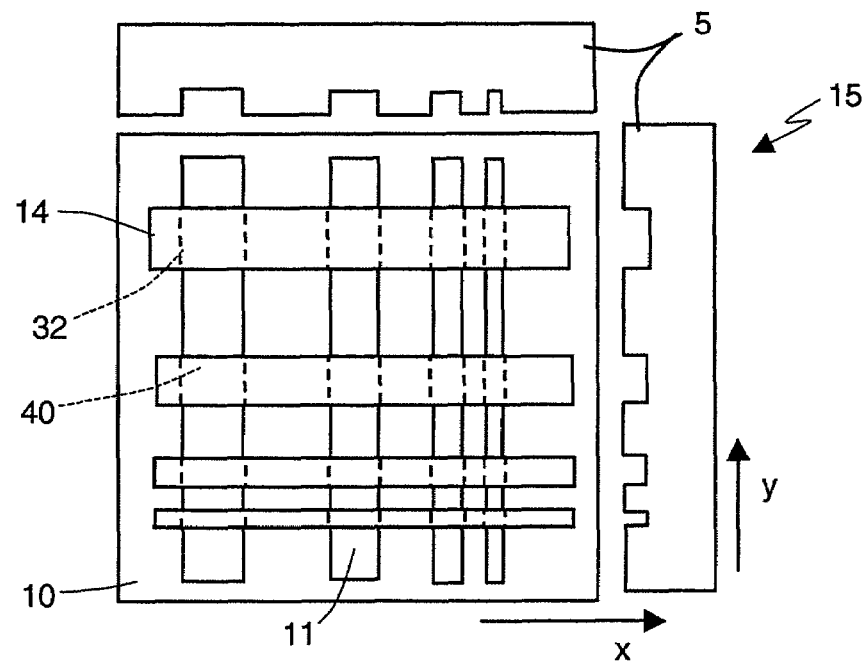

For example, as is shown in FIG. 22, a mold 5 can be formed with grooves 7 having different widths in the second direction x, and also having different spacings between one another in the same direction. FIG. 23 shows a memory structure formed from this mold, in which the memory cells, designated by 40 and defined by the intersection of the top- and bottom-electrode strips 11, 14, have different active areas. Furthermore, FIG. 24 shows a mold 28 for obtaining the second type of memory structure, in which the cavities 29 have dimensions different from one another so as to provide once again memory cells 40 with different active areas, as is evident from the corresponding memory structure shown in FIG. 25.

In particular, memory structures of this type are very useful for providing test-pattern structures, for the preliminary step of electrical and morphological characterization (in terms of area and spacing) of the memory cells that will constitute the basic elements of the memory. To evaluate operation and scalability of the memory according to the type of application it is possible to produce various test structures with one and the same mold, and then choose the optimal values of area and spacing.

Moreover, the versatility of the mold enables modification of the thicknesses of the memory cells, by varying the height of the grooves, even within one and the same mold.

The second type of memory structure, which envisages the use of organic material patterned in both directions, is advantageous in so far as it eliminates phenomena of cross-talk between the cells, enabling maximum compacting of the memory. A limit of this embodiment is, however, linked to the possible difficulties of alignment of the pads of organic material on the strips of bottom electrode previously formed. A further advantage of this embodiment is represented, however, by the possibility of making multilayer structures between the top and bottom electrodes.

Finally, it is clear that modifications and variations can be made to what has been described and illustrated herein without thereby departing from the scope of the present invention, as defined in the annexed claims.

In particular, the described techniques can be used also for obtaining multilayer memory structures, constituted by the superposition of a number of cross-point structures.

The process described can use a combination of the soft-lithography techniques examined. For example, the layers of bottom electrode and of active material can be formed with the microtransfer-molding technique, and the layer of top electrode can be formed with the micromolding-in-capillary technique, or vice versa.

In addition, for structures having dimensions that are not too small (for example, in the region of 20 μm), the use of conventional lithography can be completely eliminated even in the step of formation of the master. In this case, it is in fact possible to mold directly a CAD-designed pattern on a polymer sheet that can act as mask once it is set in contact with a photoresist.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for manufacturing a non-volatile memory structure, comprising: forming bottom electrodes on a substrate; forming areas of active material on said bottom electrodes; and forming top electrodes on said areas of active material, memory cells of said non-volatile memory structure being defined at an intersection of said bottom electrodes with said top electrodes; wherein at least one of said steps of forming bottom electrodes, forming areas of active material, and forming top electrodes comprises use of soft-lithography techniques; wherein said step of using soft-lithography techniques comprises: forming a first mold having a plurality of grooves extending in a first direction and portions in relief arranged between grooves consecutive in a second direction; and using said mold for forming at least one from among said bottom electrodes, said areas of active material, and said top electrodes.

2. The process for manufacturing a non-volatile memory structure according to claim 1, wherein said soft-lithography techniques are chosen from amongst "microtransfer molding", "micromolding in capillary", and "microcontact printing".

3. The process for manufacturing a non-volatile memory structure according to claim 1, wherein said first mold comprises a polymeric material, preferably polydimethylsiloxane; said bottom and top electrodes comprise a conductive, in particular polymeric or metal, material; and said areas of active material comprise an organic material characterized by two stable states having different electrical properties.

4. The process for manufacturing a non-volatile memory structure according to claim 1, wherein said grooves have a different width and/or a different distance from one another in said second direction, and/or a different depth.

5. The process for manufacturing a non-volatile memory structure according to claim 4, wherein said non-volatile memory structure defines a test structure, and said memory cells have different active areas.

6. The process for manufacturing a non-volatile memory structure according to claim 1, wherein said step of forming areas of active material comprises forming said areas of active material in a way self-aligned with said bottom electrodes or said top electrodes.

7. The process for manufacturing a non-volatile memory structure according to claim 6, wherein said step of forming areas of active material and a first one from among said steps of forming bottom electrodes and forming top electrodes are carried out simultaneously via one and the same step of soft lithography, in particular via "microtransfer molding".

8. The process for manufacturing a non-volatile memory structure according to claim 7, wherein said step of soft lithography comprises: filling said grooves of said first mold with respective first-electrode regions and regions of active material, set on top of one another; arrange said first mold on said substrate with said grooves facing said substrate and with a first orientation with respect to said substrate; and then removing said first mold from said substrate.

9. The process for manufacturing a non-volatile memory structure according to claim 6, wherein said step of forming areas of active material and a first one from among said steps of forming bottom electrodes and forming top electrodes are performed via one and the same step of soft lithography, in particular via "micromolding in capillary".

10. The process for manufacturing a non-volatile memory structure according to claim 9, wherein said step of soft lithography comprises: arranging said first mold on said substrate with said grooves facing said substrate and with a first orientation with respect to said substrate; introducing first electrode regions starting from a liquid solution within said grooves and consolidating said first electrode regions; introducing regions of active material starting from a liquid solution within said grooves and consolidating said regions of active material, said first electrode regions being set on top of one another; and then removing said first mold from said substrate.

11. The process for manufacturing a non-volatile memory structure according to claim 8, wherein a second between said step of forming bottom electrodes and said step of forming top electrodes is performed by means of a respective step of soft lithography, and comprises arranging said first mold above said substrate with said grooves facing said substrate and with a second orientation with respect to said substrate, said second orientation being transverse to said first orientation.

12. The process for manufacturing a non-volatile memory structure according to claim 6, wherein said step of forming areas of active material and a first one from between said step of forming bottom electrodes and said step of forming top electrodes are performed via a step of soft lithography, in particular via "microcontact printing".

13. The process for manufacturing a non-volatile memory structure according to claim 12, wherein said step of soft lithography comprises: forming on said substrate a layer of conductive material; forming on said portions in relief of said first mold a self-assembled monolayer; arranging said first mold on said substrate with said grooves facing said substrate and with a first relative orientation with respect to said substrate, so that said self-assembled monolayer contacts and is transferred onto said conductive layer; then removing said first mold from said substrate; etching said conductive layer using said self-assembled monolayer as etching mask so as to form said bottom electrodes; and forming on top of said bottom electrodes, using said self-assembled monolayer as template, said areas of active material.

14. The process for manufacturing a non-volatile memory structure according to claim 1, wherein said step of using soft-lithography techniques further comprises making a second mold having a plurality of cavities aligned to one another in said first direction, and separated in said second direction by a distance of separation substantially equal to a corresponding distance of separation between said grooves of said first mold; wherein said first mold is used for forming said bottom and top electrodes, and said second mold is used for forming said areas of active material set between said bottom electrodes and said top electrodes.

15. The process for manufacturing a non-volatile memory structure according to claim 14, wherein said step of forming areas of active material comprises: filling said cavities of said second mold with regions of active material; arranging said mold above said substrate so that said cavities are facing and are in contact with said bottom electrodes; and then removing said second mold from said substrate so as to form said areas of active material on said bottom electrodes.

16. The process for manufacturing a non-volatile memory structure according to claim 15, wherein filling said cavities of said second mold with regions of active material comprises filling said cavities with regions set on top of one another of a first conductive material, of an active organic material, and of a second conductive material.

17. The process for manufacturing a non-volatile memory structure according to claim 8, wherein said regions of active material comprise solutions of polymers, of polymers and metallic nanoparticles or small organic molecules, chosen from among: polystyrene with nanoparticles of gold combined with acetone; poly[vinyl carbazole-co-eu(vinyl benzoate)(2-thenoyl trifluoroacetone) phenanthroline ](pkeu) combined with tetrahydrofuran; polymethylmethacrylate (pmma) combined with methyl ethyl ketone; polybuthylmethacrylate (pbma) combined with methyl ethyl ketone; poly(vinylidene fluoride-trifluoroethylene) (p(vdf-trfe)) combined with methyl ethyl ketone; or else molecules of rose bengal, fluorescine or its derivatives combined with methanol.

18. The process for manufacturing a non-volatile memory structure according to claim 1, wherein said non-volatile memory structure is of a cross-point type, and said areas of active material define an array of said memory cells.

19. The process according to claim 3, wherein said polymeric material comprises polydimethylsiloxane.

* * * * *